US010742181B2

(12) United States Patent
Kim et al.

(10) Patent No.: US 10,742,181 B2
(45) Date of Patent: Aug. 11, 2020

(54) BUFFER CIRCUIT TO ADJUST SIGNAL VOLTAGE AND MEMORY DEVICE HAVING THE SAME

(71) Applicant: SK hynix Inc., Gyeonggi-do (KR)

(72) Inventors: Dong Hyun Kim, Gyeonggi-do (KR); Eun Ji Choi, Gyeonggi-do (KR); Yo Han Jeong, Gyeonggi-do (KR); Jae Heung Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/164,187

(22) Filed: Oct. 18, 2018

(65) Prior Publication Data

US 2019/0296742 A1 Sep. 26, 2019

(30) Foreign Application Priority Data

Mar. 21, 2018 (KR) ........................ 10-2018-0032844

(51) Int. Cl.

*H03F 3/45* (2006.01)
*G11C 7/10* (2006.01)
*H03K 19/0185* (2006.01)

(52) U.S. Cl.

CPC ............. *H03F 3/45* (2013.01); *G11C 7/1084* (2013.01); *H03K 19/018528* (2013.01)

(58) Field of Classification Search

CPC ...................... H03K 19/018528; G11C 7/1084
See application file for complete search history.

(56) References Cited

U.S. PATENT DOCUMENTS

| | | | | |
|---|---|---|---|---|
| 6,720,805 | B1 * | 4/2004 | Haas | H03F 3/45183 326/83 |
| 8,575,969 | B2 * | 11/2013 | Sakakibara | H03K 19/018585 327/53 |
| 10,163,465 | B1 * | 12/2018 | Ko | G11C 7/1006 |
| 2007/0046373 | A1 * | 3/2007 | Staples | H03F 3/45183 330/258 |

FOREIGN PATENT DOCUMENTS

| | | |
|---|---|---|
| KR | 100791934 | 1/2008 |
| KR | 101743062 | 6/2017 |

* cited by examiner

*Primary Examiner* — Ajay Ojha
(74) *Attorney, Agent, or Firm* — IP & T Group LLP

(57) ABSTRACT

A buffer circuit includes a first buffer configured to operate at an external power voltage, generate first and second buffer signals by comparing an input signal with a reference voltage, and control potential levels of the first and second buffer signals in response to a common mode feedback voltage; a second buffer configured to operate at an internal power voltage and generate an output signal in response to the first and second buffer signals; and a replica circuit configured to generate the common mode feedback voltage to be less than the internal power voltage.

21 Claims, 8 Drawing Sheets

BUFFER CIRCUIT TO ADJUST SIGNAL VOLTAGE AND MEMORY DEVICE HAVING THE SAME

CROSS-REFERENCE TO RELATED APPLICATION

The present application claims priority under 35 U.S.C. § 119(a) to Korean patent application number 10-2018-0032844, filed on Mar. 21, 2018, which is incorporated herein by reference in its entirety.

BACKGROUND

1. Field of Invention

Various embodiments of the invention relate to an electronic device, and more particularly, to a buffer circuit and a semiconductor device including the buffer circuit.

2. Description of Related Art

The current widespread use of mobile information devices using memory systems as storage media, particularly, smartphones and tablet personal computers (PCs) has increased the importance of, and interest in, memory devices.

With the appearance of various applications, as well as parallel processing using a high-speed processor or a multi-core processor, requirements for semiconductor memory systems are increasing in terms of both performance and reliability.

A memory system is a storage device manufactured using a semiconductor such as silicon (Si), germanium (Ge), gallium arsenide (GaAs), or indium phosphide (InP). Memory systems may be classified into volatile memory devices and non-volatile memory devices. Volatile memory devices lose stored data when the power is off. Examples of volatile memory devices may include Static Random Access Memory (RAM) (SRAM), Dynamic RAM (DRAM) and Synchronous DRAM (SDRAM). Non-volatile memory devices can retain stored data regardless of power on/off conditions. Examples of non-volatile memory include Read Only Memory (ROM), Programmable ROM (PROM), Erasable Programmable ROM (EPROM), Electrically Erasable and Programmable ROM (EEPROM), flash memory, Phase-change Random Access Memory (PRAM), Magnetic RAM (MRAM), Resistive RAM (RRAM) and Ferroelectric RAM (FRAM). Flash memories may be classified into NOR-type memories and NAND-type memories.

SUMMARY

Various embodiments are directed to a buffer circuit reducing an output variation depending on a duty cycle and temperature, and a memory device including the buffer circuit.

In accordance with an embodiment, a buffer circuit may include a first buffer configured to operate at an external power voltage, generate first and second buffer signals by comparing an input signal with a reference voltage, and control potential levels of the first and second buffer signals in response to a common mode feedback voltage, a second buffer configured to operate at an internal power voltage and generate an output signal in response to the first and second buffer signals, and a replica circuit configured to generate the common mode feedback voltage to be less than the internal power voltage.

In accordance with an embodiment, a buffer circuit may include a first buffer configured to operate at an external power voltage, generate first and second buffer signals by comparing an input signal with a reference voltage, and control potential levels of the first and second buffer signals on the basis of a self-voltage, a second buffer configured to operate at the external power voltage, generate third and fourth buffer signals in response to the first and second buffer signals, and control potential levels of the third and fourth buffer signals to be less than an internal power voltage on the basis of a common mode feedback voltage, and a third buffer configured to operate at the internal power voltage and generate an output signal in response to the third and fourth buffer signals.

In accordance with an embodiment, a memory device may include a buffer circuit configured to buffer an input signal from an external device and output a buffered input signal as an output signal; and an internal circuit configured to perform operations in response to the output signal output from the buffer circuit, wherein the buffer circuit comprises a first buffer configured to operate at an external power voltage, generate first and second buffer signals by comparing the input signal with a reference voltage, and control potential levels of the first and second buffer signals in response to a common mode feedback voltage, a second buffer configured to operate at an internal power voltage and generate the output signal in response to the first and second buffer signals, and a replica circuit configured to generate the common mode feedback voltage to be less than the internal power voltage.

In accordance with an embodiment, a buffer circuit may include a first buffer configured to operate at an external voltage, receive an input signal, and generate at least one first buffer signal corresponding to the input signal based on a self-voltage, which is generated based on the external voltage, the first buffer signal having a level of the external voltage; a second buffer configured to operate at the external voltage, receive the first buffer signal, and generate at least one second buffer signal corresponding to the first buffer signal based on a common mode feedback voltage, which is generated based on an internal voltage, the second buffer signal having a level equal to or less than the internal voltage; and a third buffer configured to operate at the internal voltage, receive the second buffer signal, and generate an output signal corresponding to the second buffer signal.

DETAILED DESCRIPTION

Figure 1:
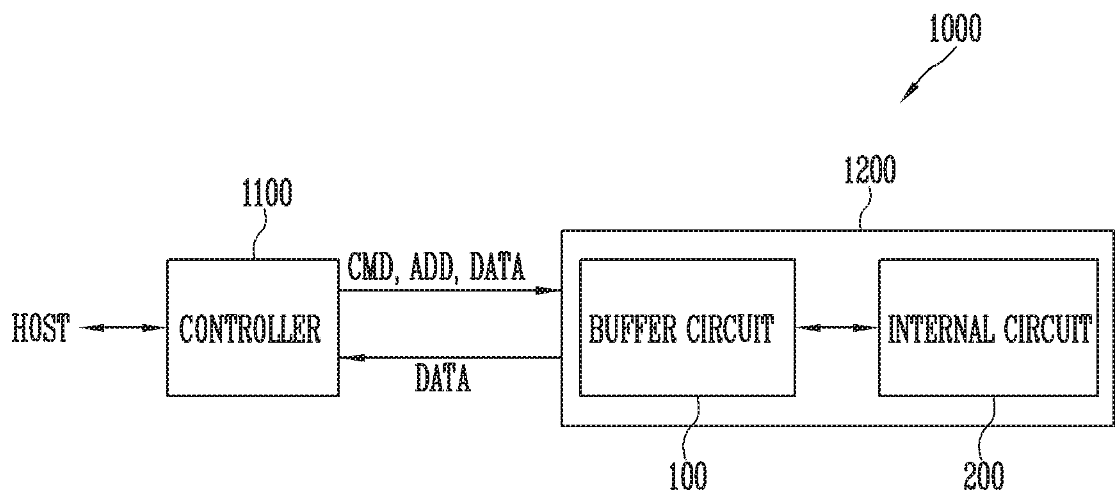
FIG. 1 is a block diagram illustrating a memory system including a memory device in accordance with an embodiment of the present disclosure.

Various embodiments will now be described more fully hereinafter with reference to the accompanying drawings. However, they may be embodied in different forms, and thus the present invention is not limited to the embodiments set forth herein. Rather, these embodiments are provided so that this disclosure is thorough and complete and fully conveys the scope of the embodiments to those skilled in the art. Moreover, throughout the specification, reference to "an embodiment," "another embodiment," or the like is not necessarily to only one embodiment, and different references to any such phrase are not necessarily to the same embodiment(s).

Various modifications and changes may be made to any of the disclosed embodiments in accordance with the inventive concepts. Accordingly, the present invention is not limited to specified disclosures. Rather, the present invention includes all changes, equivalents, or substitutes that do not depart from the spirit and technical scope of the present disclosure.

While terms such as "first" and "second" may be used to identify various components, such components must not be understood as being limited to the above terms. The above terminologies are used to distinguish one component from the other component that otherwise have the same or similar names. For example, a first component may be referred to as a second component without limiting such component and similarly, a second component may be referred to as a first component.

It will be understood that when an element is referred to as being "coupled" or "connected" to another element, it can be directly coupled or coupled to the other element or intervening elements may also be present. In contrast, when an element is referred to as being "directly coupled" or "directly connected" to another element, no intervening elements are present. Other expressions describing relationships between components such as "~ between," "immediately ~ between" or "adjacent to ~" and "directly adjacent to ~" may be construed similarly.

The terms used in the present application are merely used to describe particular embodiments, and are not intended to limit the present disclosure. Singular forms in the present disclosure are intended to include the plural forms and vice versa, unless the context clearly indicates otherwise. In the present specification, it should be understood that terms "include" or "have" indicate that a stated feature, a number, a step, an operation, a component, a part or the combination those of described in the specification is present, but do not exclude the presence or addition of one or more other features, numbers, steps, operations, components, parts or combinations thereof.

So far as not being differently defined, all terms used herein including technical or scientific terminologies have meanings that they are commonly understood by those skilled in the art to which the present disclosure pertains. The terms defined in generally used dictionaries should be construed as having the same meanings as would be construed in the context of the related art, and unless clearly defined otherwise in this specification, should not be construed as having idealistic or overly formal meanings.

Well-known processes, device structures, and technologies may not be described in detail to avoid unnecessarily obscuring features of the present invention.

Various embodiments of the present disclosure will be described in detail with reference to the accompanying drawings in order for those skilled in the art to be able to readily implement the present disclosure.

FIG. 1 is a diagram illustrating a memory system 1000 in accordance with an embodiment of the present disclosure.

Referring to FIG. 1, the memory system 1000 may include a controller 1100 and a memory device 1200.

The controller 1100 may control the memory device 1200 in response to a request from a host.

The controller 1100 may control the memory device 1200 to perform a program operation, a read operation, or an erase operation. During a program operation, the controller 1100 may provide a program command CMD, an address ADD, and data DATA to the memory device 1200 through a channel. During a read operation, the controller 1100 may provide a read command CMD and an address ADD to the memory device 1200 through a channel. During an erase operation, the controller 1100 may provide an erase command CMD and an address ADD to the memory device 1200 through a channel.

The memory device 1200 may be controlled by the controller 1100. The memory device 1200 may include a memory cell array having a plurality of memory blocks storing data therein. In accordance with an embodiment, the memory device 1200 may be a flash memory device.

The memory device 1200 may be configured to receive the command CMD and the address ADD through the channel from the controller 1100 and access an area selected by the address ADD in the memory cell array. In other words, the memory device 1200 may perform an internal operation corresponding to the command CMD on the area selected by the address ADD.

For example, the memory device 1200 may perform general operations including a program operation, a read operation, and an erase operation. During a program operation, the memory device 1200 may program the data DATA into the area selected by the address ADD. During a read operation, the memory device 1200 may read the data DATA from the area selected by the address ADD. During an erase operation, the memory device 1200 may erase the data stored in the selected area by the address ADD.

The memory device 1200 may include a buffer circuit 100 and an internal circuit 200.

The buffer circuit 100 may receive a plurality of signals from the controller 1100 to output these signals to the internal circuit 200, and may receive a plurality of signals from the internal circuit 200 to output these signals to the controller 1100. For example, the buffer circuit 100 may receive and buffer the command CMD, the address ADD, and the data DATA from the controller 1100, and may output the buffered command CMD, address ADD, and data DATA to the internal circuit 200. In addition, the buffer circuit 100 may receive the data DATA from the internal circuit 200, buffer the data DATA, and output the buffered data DATA to the controller 1100.

Figure 2:
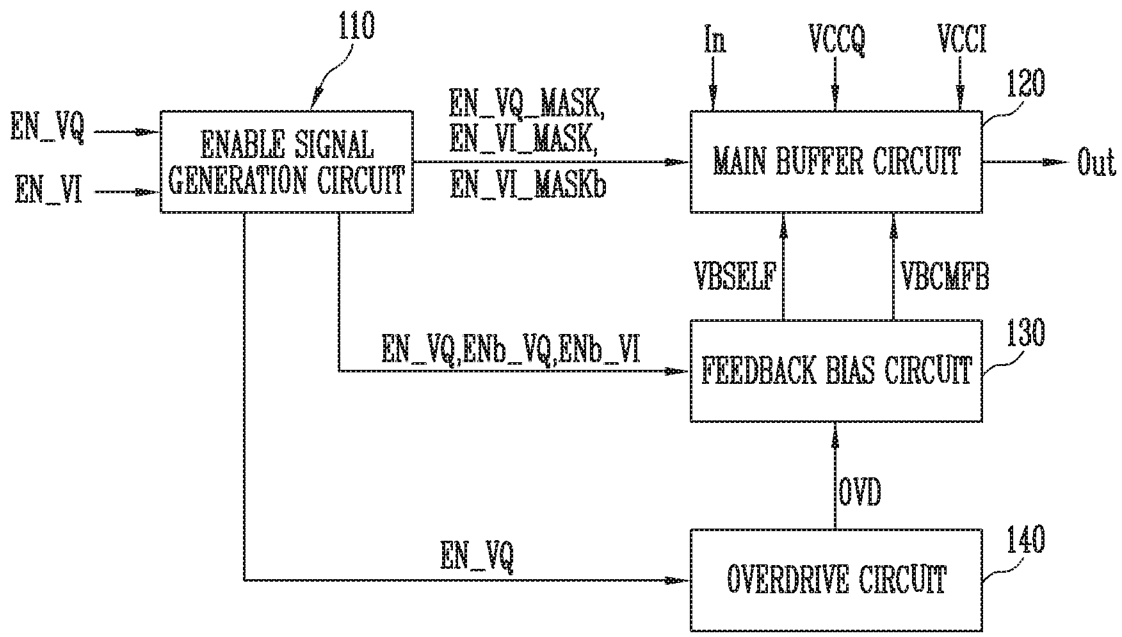
FIG. 2 is a diagram illustrating an exemplary buffer circuit shown in FIG. 1.

FIG. 2 is a diagram illustrating the buffer circuit 100 shown in FIG. 1.

Referring to FIG. 2, the buffer circuit 100 may include an enable signal generation circuit 110, a main buffer circuit 120, a feedback bias circuit 130, and an overdrive circuit 140.

The enable signal generation circuit 110 may generate and output an external voltage enable mask signal EN_VQ_MASK, an internal voltage enable mask signal EN_VI_MASK, an inverted internal voltage enable mask signal EN_VI_MASKb, an inverted external voltage enable signal ENb_VQ, and an inverted internal voltage enable signal ENb_VI in response to an external voltage enable signal EN_VQ and an internal voltage enable signal EN_VI. In addition, the enable signal generation circuit 110 may output the external voltage enable signal EN_VQ again.

The main buffer circuit 120 may buffer an input signal In to output an output signal Out. The input signal In may be the command CMD, the address ADD, or the data DATA as shown in FIG. 1, and the output signal Out may be output to the internal circuit 200 of FIG. 1.

The main buffer circuit 120 may receive an external power voltage VCCQ and an internal power voltage VCCI, and may reduce a change in duty cycle caused by a difference between the external power voltage VCCQ and the internal power voltage VCCI by using a self-voltage VBSELF and a common mode feedback voltage VBCMFB output from the feedback bias circuit 130.

The feedback bias circuit 130 may generate the self-voltage VBSELF and the common mode feedback voltage VBCMFB in response to the external voltage enable signal EN_VQ, the inverted external voltage enable signal EN_VQ, and the inverted internal voltage enable signal ENb_VI.

The feedback bias circuit 130 may include a replica circuit of the main buffer circuit 120. The feedback bias circuit 130 may generate the common mode feedback voltage VBCMFB at a level of the internal power voltage VCCI. To do this, the feedback bias circuit 130 generates the common mode feedback voltage VBCMFB by using a divided voltage value obtained by dividing the internal power voltage VCCI by ½, and outputs the common mode feedback voltage VBCMFB to an output terminal of the replica circuit. In addition, the feedback bias circuit 130 may divide the external power voltage VCCQ and output the divided external power voltage as the self-voltage VBSELF.

The overdrive circuit 140 may overdrive a supply voltage OVD to more than a target voltage level and apply the overdriven voltage to the feedback bias circuit 130 in response to the external voltage enable signal EN_VQ during an initial setting operation of the buffer circuit 100, i.e., a setting operation period of the buffer circuit 100. The overdrive circuit 140 may reduce the supply voltage OVD to the target voltage level after the initial setting operation.

Figure 3:
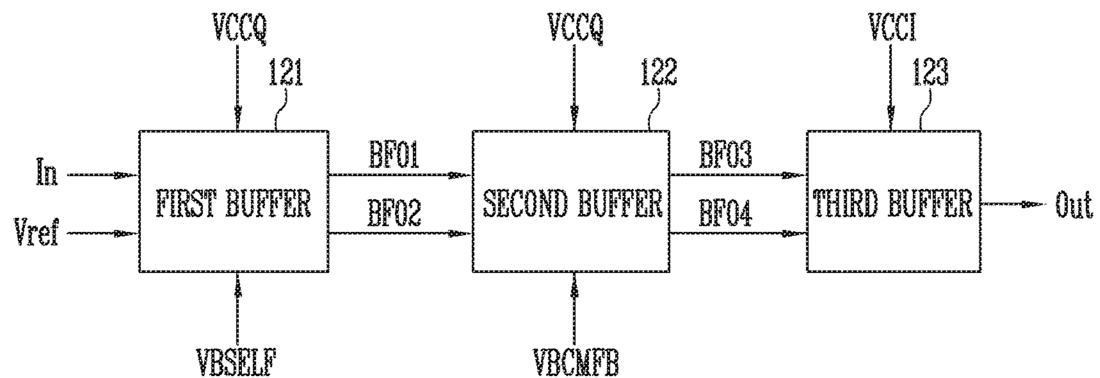
FIG. 3 is a diagram illustrating an exemplary main buffer circuit shown in FIG. 2.

FIG. 3 is a diagram illustrating the main buffer circuit 120 shown in FIG. 2.

Referring to FIG. 3, the main buffer 120 may include a first buffer 121, a second buffer 122, and a third buffer 123. In accordance with this embodiment, the main buffer 120 including the first to third buffers 121 to 123 is illustrated and described. However, the main buffer circuit 120 may include at least one buffer operating at the external power voltage VCCQ and at least one buffer operating at the internal power voltage VCCI.

The first buffer 121 may operate at the external power voltage VCCQ, and may generate and output a first buffer signal BF01 and a second buffer signal BF02 according to a result of comparing a potential level of the input signal In with a potential level of a reference voltage Vref. In addition, the potential levels of the first buffer signal BF01 and the second buffer signal BF02, which are output from the first buffer 121, may be controlled depending on a potential level of the self-voltage VBSELF.

The second buffer 122 may operate at the external power voltage VCCQ, and may generate and output a third buffer signal BF03 and a fourth buffer signal BF04 in response to the first buffer signal BF01 and the second buffer signal BF02, respectively. The second buffer 122 may control the potential levels of the third buffer signal BF03 and the fourth buffer signal BF04 to the level of the internal power voltage VCCI in accordance with the potential level of the common mode feedback voltage VBCMFB.

The third buffer 123 may operate at the internal power voltage VCCI, and may generate and output the output signal Out in response to the third buffer signal BF03 and the fourth buffer signal BF04.

As described above, the main buffer circuit 120 may include one or more buffers (i.e., first buffer and second buffer) operating at the external power voltage VCCQ and at least one buffer (i.e., third buffer) operating at the internal power voltage VCCI, and the second buffer operating at the external power voltage VCCQ may output the buffer signals (i.e., BF03 and BF04) by controlling the potential levels of the buffer signals to the internal power voltage VCCI in accordance with the common mode feedback voltage VBCFMB. As a result, a level shifter for changing the potential levels of the buffer signals (i.e., BF03 and BF04) to the internal power voltage VCCI may be unnecessary, so that a duty cycle variation caused by the level shifter may be avoided.

Figure 4:
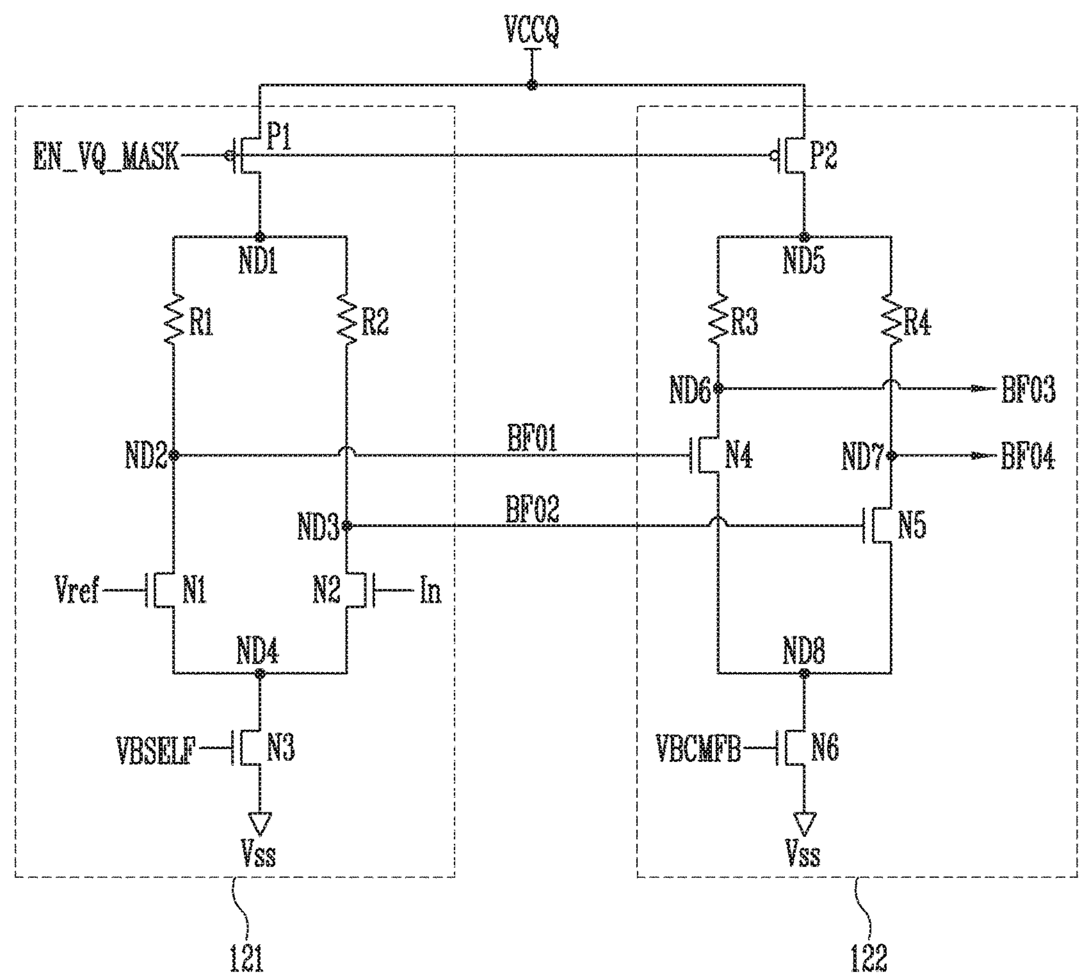
FIG. 4 is a circuit diagram illustrating an exemplary first buffer and a second buffer shown in FIG. 3.

FIG. 4 is a circuit diagram illustrating the first buffer 121 and the second buffer 122 shown in FIG. 3.

Referring to FIG. 4, the first buffer 121 may include a PMOS transistor P1, resistors R1 and R2, and NMOS transistors N1, N2, and N3.

The PMOS transistor P1 may be coupled between a terminal or node for the external power voltage VCCQ and a node ND1, and may supply or block the external power voltage VCCQ to the first buffer 121 in response to an external voltage enable mask signal EN_VQ_MASK.

The resistor R1 and the NMOS transistor N1 may be coupled in series between the node ND1 and a node ND4. The NMOS transistor N1 may control the amount of current flowing to the node ND4 on the basis of the reference voltage Vref.

The resistor R2 and the NMOS transistor N2 may be coupled in series between the node ND1 and the node ND4. The NMOS transistor N2 may control the amount of current flowing to the node ND4 on the basis of the input signal In.

The NMOS transistor N3 may be coupled between the node ND4 and a terminal for a ground voltage Vss and control the amount of current flowing to the terminal for the ground voltage Vss in response to the self-voltage VBSELF.

Operations of the first buffer 121 are described below.

The PMOS transistor P1 may be turned on in response to the external voltage enable mask signal EN_VQ_MASK input at a low level, so that the external power voltage VCCQ may be applied to the node ND1. In addition, the transistor N3 may be turned on in response to the self-voltage VBSELF applied at a set or predetermined level, so that the ground voltage Vss may be applied to the node ND4.

When the potential level of the input signal In is lower than that of the reference voltage Vref, a potential level of a node ND2 between the resistor R1 and the NMOS transistor N1 may be gradually less than a potential level of a node ND3 between the resistor R2 and the NMOS transistor N2, so that the first buffer signal BF01 at a low level and the second buffer signal BF02 having a level of the external power voltage VCCQ may be output.

When the potential level of the input signal In is greater than that of the reference voltage Vref, the potential level of the node ND2 between the resistor R1 and the NMOS transistor N1 may be gradually greater than the potential level of the node ND3 between the resistor R2 and the NMOS transistor N2, so that the first buffer signal BF01 having the level of the external power voltage VCCQ and the second buffer signal BF02 at a low level may be output.

The second buffer 122 may include a PMOS transistor P2, resistors R3 and R4, and NMOS transistors N4, N5, and N6.

The PMOS transistor P2 may be coupled between a terminal for the external power voltage VCCQ and a node ND5, and may supply or block the external power voltage VCCQ to the second buffer 122 in response to the external voltage enable mask signal EN_VQ_MASK.

The resistor R3 and the NMOS transistor N4 may be coupled in series between the node ND5 and a node ND8. The NMOS transistor N4 may control the amount of current flowing to the node ND8 on the basis of the first buffer signal BF01.

The resistor R4 and the NMOS transistor N5 may be coupled in series between the node ND5 and the node ND8. The NMOS transistor N5 may control the amount of current flowing to the node ND8 on the basis of the second buffer signal BF02.

The NMOS transistor N6 may be coupled between the node ND8 and a terminal for a ground voltage Vss and control the amount of current flowing to the terminal for the ground voltage Vss in response to the common mode feedback voltage VBCMFB. The common mode feedback voltage VBCMFB may have a lower potential level than the internal power voltage VCCI. For example, the potential level of the common mode feedback voltage VBCMFB may be half (½) of that of the internal power voltage VCCI.

Operations of the second buffer 122 are described below.

The PMOS transistor P2 may be turned on in response to the external voltage enable mask signal EN_VQ_MASK at a low level, so that the external power voltage VCCQ may be applied to the node ND5. In addition, the NMOS transistor N6 may be turned on in response to the common mode feedback voltage VBCMFB having a lower potential level than the internal power voltage VCCI, so that the ground voltage Vss may be applied to the node ND8.

When the first buffer signal BF01 having a low level and the second buffer signal BF02 having the level of the external power voltage VCCQ are input, a potential level of a node ND6 between the resistor R3 and the NMOS transistor N4 may be gradually greater than a potential level of a node ND7 between the resistor R4 and the NMOS transistor N5, so that the third buffer signal BF03 having a high level and the fourth buffer signal BF04 having a low level may be output.

When the first buffer signal BF01 having the level of the external power voltage VCCQ and the second buffer signal BF02 having a low level are input, the potential level of the node ND6 between the resistor R3 and the NMOS transistor N4 may be gradually less than the potential level of the node ND7 between the resistor R4 and the NMOS transistor N5, so that the third buffer signal BF03 having a low level and the fourth buffer signal BF04 having a high level may be output.

The potential levels of the third buffer signal BF03 and the fourth buffer signal BF04 which are output by the second buffer 122 by controlling the amount of current flowing from the node ND8 to the terminal for the ground voltage Vss by the common mode feedback voltage VBCMFB may be less than or equal to the internal power voltage VCCI.

Figure 5:
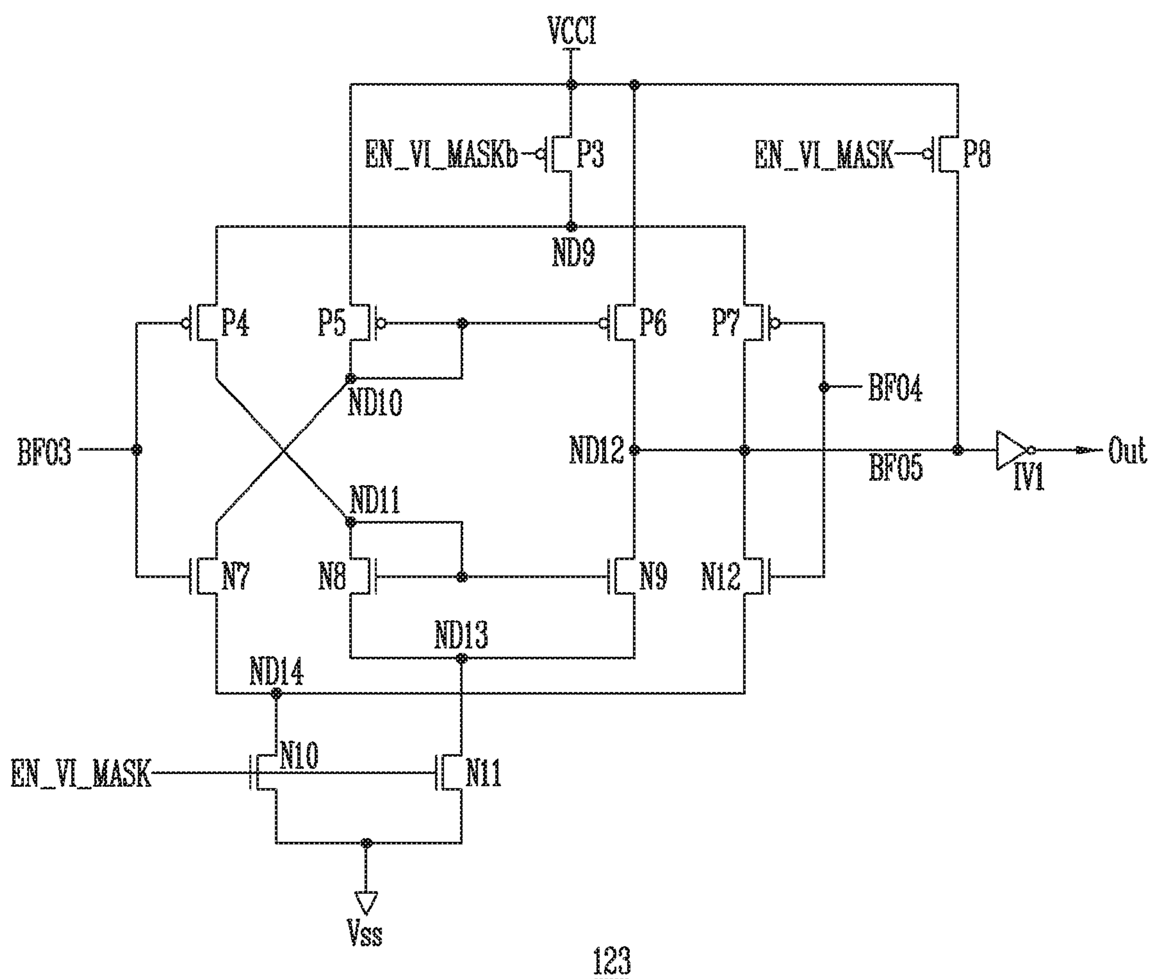
FIG. 5 is a circuit diagram illustrating an exemplary third buffer shown in FIG. 3.

FIG. 5 is a circuit diagram illustrating the third buffer 123 shown in FIG. 3.

Referring to FIG. 5, the third buffer 123 may include PMOS transistors P3, P4, P5, P6, P7, and P8, NMOS transistors N7, N8, N9, N10, N11, and N12, and an inverter IV1.

The PMOS transistors P3 may be coupled between a terminal for the internal power voltage VCCI and a node ND9, and may supply or block the internal power voltage VCCI to the node ND9 in response to an inverted internal voltage enable mask signal EN_VI_MASKb.

The PMOS transistor P4 and the NMOS transistor N8 may be coupled in series between the node ND9 and a node ND13. The PMOS transistor P4 may be turned on or off in response to the third buffer signal BF03, and may have a diode connection structure in which a gate of the NMOS transistor N8 is coupled to a drain (i.e., node ND11) of the PMOS transistor P4.

The PMOS transistor P5 and the NMOS transistor N7 may be coupled in series between the terminal for the internal power voltage VCCI and a node ND14. The PMOS transistor P5 may have a diode structure in which a gate and a drain are coupled to each other, and the NMOS transistor N7 may be turned on or off in response to the third buffer signal BF03.

The PMOS transistor P6 and the NMOS transistor N9 may be coupled in series between the terminal for the internal power voltage VCCI and a node ND13. A gate of the PMOS transistor P6 may be coupled to a node ND10 which is a gate and a drain of the PMOS transistor P5, and a gate of the NMOS transistor N9 may be coupled to a node ND11 which is a gate and a drain of the NMOS transistor N8.

The NMOS transistor N10 may be coupled between the node ND14 and a terminal for the ground voltage Vss, and may be turned on or off in response to an internal voltage enable mask signal EN_VI_MASK.

The NMOS transistor N11 may be coupled between the node ND13 and the terminal for the ground voltage Vss, and may be turned on or off in response to the internal voltage enable mask signal EN_VI_MASK.

The PMOS transistor P7 and the NMOS transistor N12 may be coupled in series between the node ND9 and a node ND14. The PMOS transistor P7 and the NMOS transistor N12 may be turned on or off in response to the fourth buffer signal BF04.

The PMOS transistor P8 may be coupled between the terminal for the internal power voltage VCCI and a node ND12, and may be turned on or off in response to the internal voltage enable mask signal EN_VI_MASK.

The inverter IV1 may be coupled to the node ND12 and may invert a fifth buffer signal BF05 output through the node ND12 to output the inverted fifth buffer signal as the output signal Out.

Operations of the third buffer 123 are described below.

During a deactivation operation of the third buffer 123, the internal voltage enable mask signal EN_VI_MASK may be applied at a low level and the inverted internal voltage enable mask signal EN_VI_MASKb may be applied at a high level. As a result, the PMOS transistor P3 may be turned off, and the NMOS transistors N10 and N11 may be turned off. The PMOS transistor P8 may be turned on in response to the internal voltage enable mask signal EN_VI_MASK, and the internal power voltage VCCI may be applied to the node ND12. Therefore, the third buffer 123 may output the output signal Out fixed to a low level.

During an activation operation of the third buffer 123, the internal voltage enable mask signal EN_VI_MASK may be applied at a high level and the inverted internal voltage enable mask signal EN_VI_MASKb may be applied at a low level.

A case in which the third buffer signal BF03 having the level of the internal power voltage VCCI and the fourth buffer signal BF04 having a low level are input is described below.

In response to the inverted internal voltage enable mask signal EN_VI_MASKb having a low level, the PMOS transistor P3 may be turned on, and the internal power voltage VCCI may be applied to the node ND9. The NMOS transistor N7 may be turned on in response to the third buffer signal BF03 having the level of the internal power voltage VCCI, and a potential level of the node ND10 may gradually decrease, so that the PMOS transistor P6 may supply the internal power voltage VCCI to the node ND12. In addition, the PMOS transistor P7 may be turned on in response to the fourth buffer signal BF04 having the low level to supply the internal power voltage VCCI to the node ND12. Therefore, the node ND12 may output the fifth buffer signal BF05 having the level of the internal power voltage VCCI, and the inverter IV1 may invert the fifth buffer signal BF05 to output the inverted fifth buffer signal as the output signal Out having a low level.

A case in which the third buffer signal BF03 having the level of the internal power voltage VCCI and the fourth buffer signal BF04 having a low level are input is described below.

In response to the inverted internal voltage enable mask signal EN_VI_MASKb having a low level, the PMOS transistor P3 may be turned on, and the internal power voltage VCCI may be applied to the node ND9. The PMOS transistor P4 may be turned on in response to the third buffer signal BF03 having a low level, so that the potential level of the node ND11 may gradually increase. As a result, a potential level of the node ND12 may gradually decrease according to the current flowing through the NMOS transistor N9. In addition, the NMOS transistor N12 may be turned on in response to the fourth buffer signal BF04 having the level of the internal power voltage VCCI, so that the potential level of the node ND12 may be discharged to the level of the ground voltage Vss. Therefore, the node ND12 may output the fifth buffer signal BF05 having a low level, and the inverter IV1 may invert the fifth buffer signal BF05 to output the inverted fifth buffer signal as the output signal Out having a high level.

Figure 6:
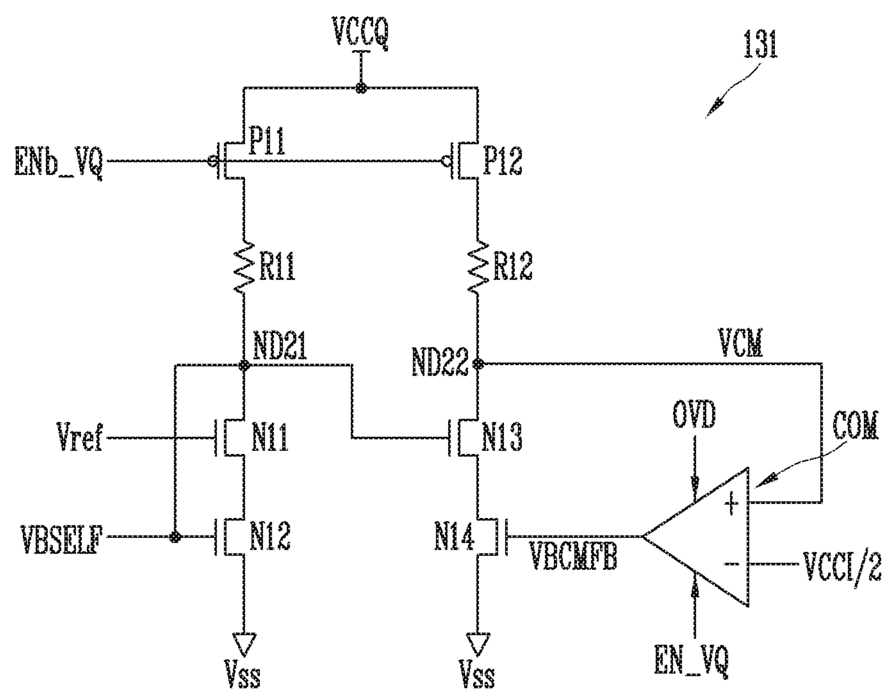
FIG. 6 is a diagram illustrating an exemplary feedback bias circuit shown in FIG. 2.
Figure 6:
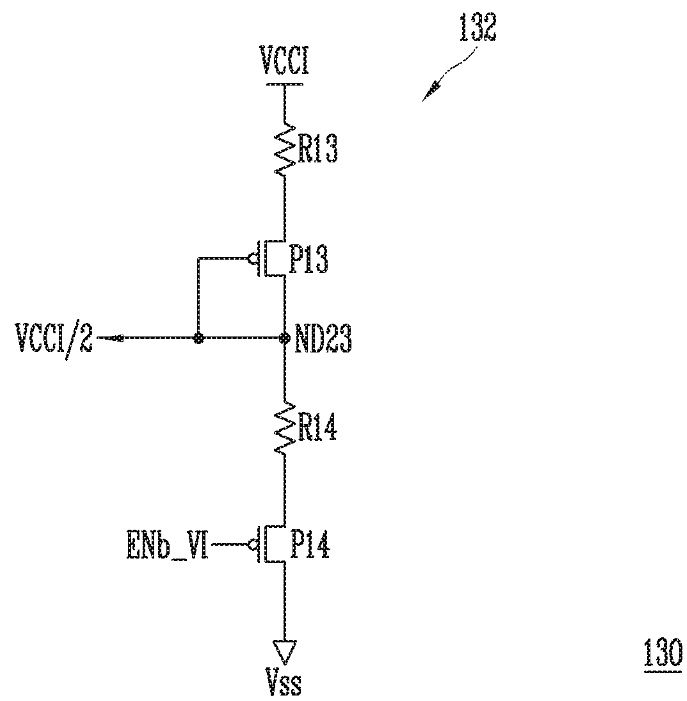

FIG. 6 is a circuit diagram illustrating the feedback bias circuit 130 shown in FIG. 2.

Referring to FIG. 6, the feedback bias circuit 130 may include a replica circuit 131 and a divided voltage generation circuit 132.

The replica circuit 131 may include PMOS transistors P11 and P12, resistors R11 and R12, NMOS transistors N11, N12, N13, and N14, and a comparator COM.

The PMOS transistor P11, the resistor R11, and the NMOS transistors N11 and N12 may be coupled in series between a terminal for the external power voltage VCCQ and a terminal for the ground voltage Vss. The PMOS transistor P11 may be turned on or off in response to the inverted external voltage enable signal ENb_VQ to receive or block the external power voltage VCCQ. The NMOS transistor N11 may be turned on or off in response to the reference voltage Vref, and the NMOS transistor N12 may be turned on or off in response to the self-voltage VBSELF. A potential level of a node ND21 between the resistor R11 and the NMOS transistor N11 may be output as the self-voltage VBSELF. In other words, the self-voltage VBSELF may be generated by dividing the external power voltage VCCQ.

The PMOS transistor P12, the resistor R12, and the NMOS transistors N13 and N14 may be coupled in series between the terminal for the external power voltage VCCQ and the terminal for the ground voltage Vss. The PMOS transistor P12 may be turned on or off in response to the inverted external voltage enable signal ENb_VQ to receive or block the external power voltage VCCQ. The NMOS transistor N13 may be turned on or off in response to the self-voltage VBSELF, and the NMOS transistor N14 may be turned on or off in response to the common mode feedback voltage VBCMFB.

The comparator COM may receive a potential level of a node ND22 between the resistor R12 and the NMOS transistor N13 as a common voltage VCM, and may generate and output the common mode feedback voltage VBCMFB by comparing the common voltage VCM with a divided voltage VCCI/2. The divided voltage VCCI/2 may be generated by dividing the internal power voltage VCCI and have a potential level less than the internal power voltage VCCI. For example, the divided voltage VCCI/2 may have a level half that of the internal power voltage VCCI.

The comparator COM may be activated in response to the external voltage enable signal EN_VQ and output the common mode feedback voltage VBCMFB by rapidly increasing the common mode feedback voltage VBCMFB to a target voltage level in response to the supply voltage OVD overdriven during an initial setting operation.

Operations of the replica circuit 131 are described below.

The PMOS transistors P11 and P12 of the replica circuit 131 may be turned on in response to the inverted external voltage enable signal ENb_VQ and receive the external power voltage VCCQ. Hereinafter, the node ND21 may have a set or predetermined potential level in response to the reference voltage Vref, so that the self-voltage VBSELF having a set or predetermined potential level may be output.

The comparator COM may generate the common mode feedback voltage VBCMFB in response to the common voltage VCM and the divided voltage VCCI/2. The comparator COM may ideally output the common mode feedback voltage VBCMFB having the same potential level as the divided voltage VCCI/2.

The divided voltage generation circuit 132 may include resistors R13 and R14 and PMOS transistors P13 and P14.

The resistor R13, the PMOS transistor P13, the resistor R14, and the PMOS transistors P14 may be coupled in series between the terminal for the internal power voltage VCCI and the terminal for the ground voltage Vss. A gate and a drain of the PMOS transistor P13 may be coupled to an output node ND23 between the PMOS transistor P13 and the resistor R14. The PMOS transistor P14 may be turned on or off in response to the inverted internal voltage enable signal ENb_VI. The resistor R13 and the resistor R14 may have the same resistance value, and the PMOS transistor P13 and the PMOS transistor P14 may have the same resistance value.

The divided voltage generation circuit 132 may be activated in response to the inverted internal voltage enable signal ENb_VI and may generate and output the divided voltage VCCI/2 by dividing the internal power voltage VCCI. The divided voltage VCCI/2 may be less than the internal power voltage VCCI. For example, a level of the divided voltage VCCI/2 may be half that of the internal power voltage VCCI.

Figure 7:
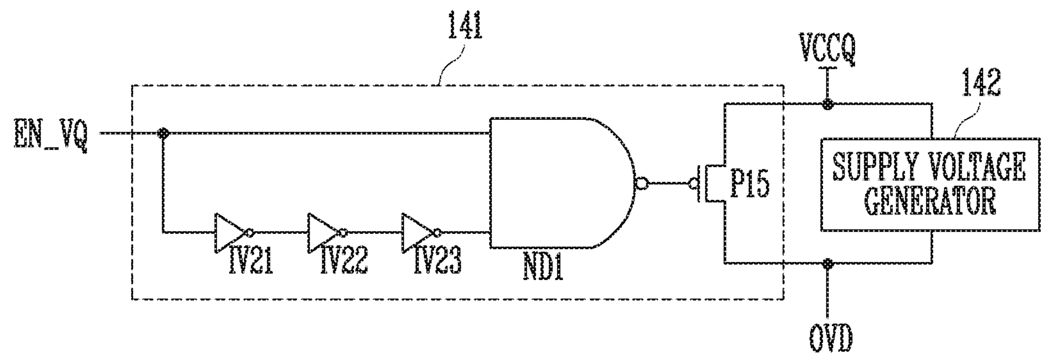
FIG. 7 is a diagram illustrating an exemplary overdrive circuit shown in FIG. 2.

FIG. 7 is a diagram illustrating the overdrive circuit 140 shown in FIG. 2.

Referring to FIG. 7, the overdrive circuit 140 may generate and output the supply voltage OVD greater than a target voltage during an initial setting period in response to the external voltage enable signal EN_VQ, and may output the supply voltage OVD at a set or predetermined level after the initial setting period.

The overdrive circuit 140 may include an overdrive component 141 and a supply voltage generator 142.

The overdrive component 141 may include a NAND gate ND1, a plurality of inverters IV21, IV22, and IV23, and a PMOS transistor P15.

The plurality of inverters IV21, IV22, and IV23 may be coupled in series. The plurality of inverters IV21, IV22, and IV23 may delay and invert the external voltage enable signal EN_VQ for a set or predetermined time, and output the delayed and inverted external voltage enable signal. The NAND gate ND1 may output a logical signal activated to a low level during a set or predetermined time, i.e., an initial setting period in response to the external voltage enable signal EN_VQ and an output signal from the inverter IV23, i.e., the delayed and inverted external voltage enable signal. The PMOS transistor P15 may overdrive an external power voltage VCCQ to the supply voltage OVD in response to the logical signal output from the NAND gate ND1.

The supply voltage generator 142 may receive the external power voltage VCCQ, and generate and output the supply voltage OVD having a target voltage level.

Figure 8:
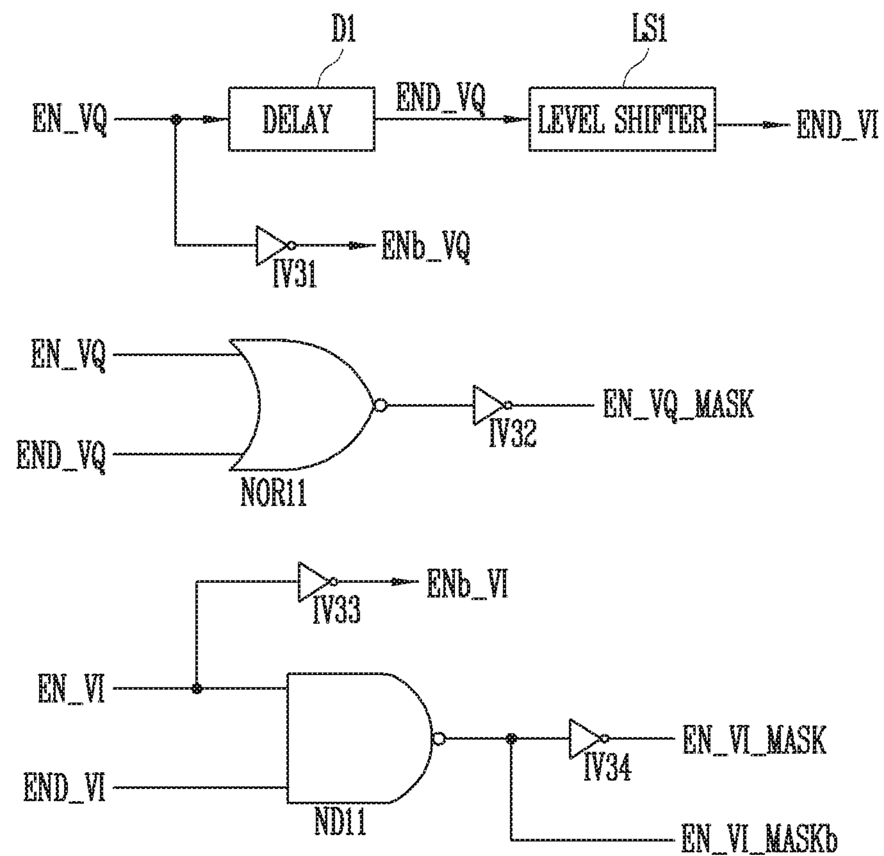
FIG. 8 is a circuit diagram illustrating an exemplary enable signal generation circuit shown in FIG. 2.

FIG. 8 is a circuit diagram illustrating the enable signal generation circuit 110 shown in FIG. 2.

Referring to FIG. 8, the enable signal generation circuit 110 may include a delay D1, a level shifter LS1, inverters IV31, IV32, IV33, and IV34, a NOR gate NOR11, and a NAND gate ND11.

The delay D1 may delay the external voltage enable signal EN_VQ for a set or predetermined time to output an external delay signal END_VQ, and the level shifter LS1 may control an output level of the external delay signal END_VQ to output an internal delay signal END_VI.

The inverter IV31 may invert the external voltage enable signal EN_VQ to output the inverted external voltage enable signal ENb_VQ.

The NOR gate NOR11 may output a logical signal in response to the external voltage enable signal EN_VQ and the external delay signal END_VQ. The inverter IV32 may invert the output signal from the NOR gate NOR11 to generate and output the external voltage enable mask signal EN_VQ_MASK.

The inverter IV33 may invert the internal voltage enable signal EN_VI to output the inverted internal voltage enable signal ENb_VI.

The NAND gate ND11 may generate and output the inverted internal voltage enable mask signal EN_VI_MASKb in response to the internal voltage enable signal EN_VI and the internal delay signal END_VI. The inverter IV34 may invert the inverted internal voltage enable mask signal EN_VI_MASKb to generate and output the internal voltage enable mask signal EN_VI_MASK.

Figure 9:
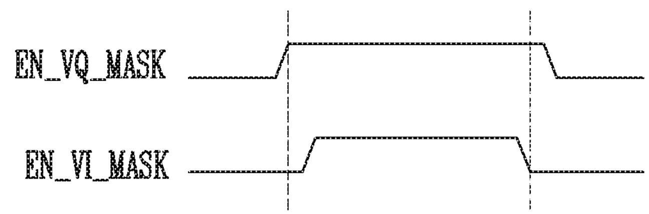
FIG. 9 is an exemplary signal waveform diagram illustrating an external voltage enable mask signal and an internal voltage enable mask signal shown in FIG. 8.

FIG. 9 is a signal waveform diagram illustrating the external voltage enable mask signal EN_VQ_MASK and the internal voltage enable mask signal EN_VI_MASK shown in FIG. 8.

Referring to FIG. 9, after the external voltage enable mask signal EN_VQ_MASK is activated from a low level to a high level, the internal voltage enable mask signal EN_VI_MASK may be activated from a low level to a high level. Accordingly, after the first and second buffers 121 and 122 of FIG. 3 may be activated first, the third buffer 123 may then be activated.

In addition, after the internal voltage enable mask signal EN_VI_MASK is deactivated from a high level to a low level, the external voltage enable mask signal EN_VQ_MASK may be deactivated from a high level to a low level. Accordingly, after the third buffer 123 is deactivated first, the first and second buffers 121 and 122 may then be deactivated.

Figure 10:
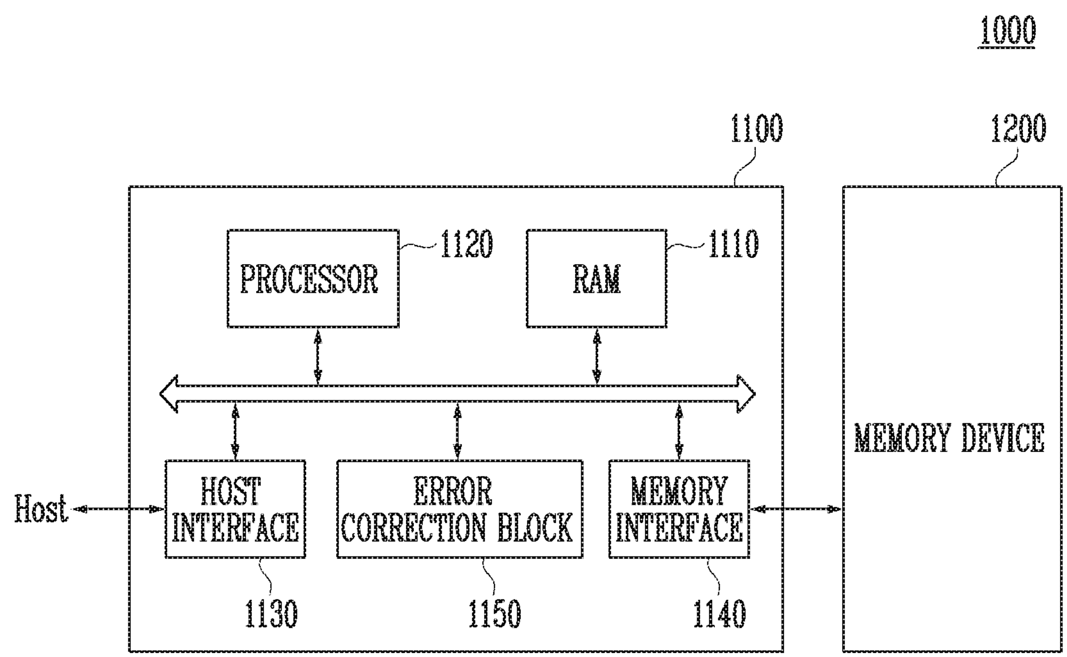
FIG. 10 is a diagram illustrating another embodiment of a memory system including a memory device shown in FIG. 1.

FIG. 10 is a diagram illustrating another embodiment of the memory system 1000 including the memory device 1200 as shown in FIG. 1.

Referring to FIG. 10, the memory system 1000 may include the memory device 1200 and the controller 1100.

The memory device 1200 may include a buffer circuit and perform operations as described above with reference to FIG. 1. Hereinafter, repetitive explanations will be omitted.

The controller 1100 may be coupled to a host and the memory device 1200. The controller 1100 may be configured to access the memory device 1200 at the request of the host. For example, the controller 1100 may control a read operation, a program operation, an erase operation, and/or a background operation of the memory device 1200. The controller 1100 may provide an interface between the memory device 1200 and the host. The controller 1100 may run firmware for controlling the memory device 1200.

The controller 1100 may include a random access memory (RAM) 1110, a processor 1120, a host interface 1130, a memory interface 1140, and an error correction block 1150.

The RAM 1110 may serve as an operation memory of the processor 1120, a cache memory between the memory device 1200 and the host, and/or a buffer memory between the memory device 1200 and the host.

The processor 1120 may control general operations of the controller 1100. In addition, the controller 1100 may temporarily store program data provided from the host during a write operation.

The host interface 1130 may include a protocol for exchanging data between the host and the controller 1100. For example, the controller 1100 may communicate with the host through any of various interface protocols including a Universal Serial Bus (USB) protocol, a multimedia card (MMC) protocol, a peripheral component interconnection (PCI) protocol, a PCI-express (PCI-e or PCI-e) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol, a private protocol, or a combination thereof.

The memory interface 1140 may interface with the memory device 1200. For example, the memory interface 1140 includes a NAND interface or a NOR interface.

The error correction block 1150 uses an error correcting code (ECC) to detect and correct an error in data received from the memory device 1200. The processor 1120 may control a read voltage according to an error detection result of the error correction block 1150 and control the memory device 1200 to perform re-read. In accordance with an embodiment, the error correction block 1150 may be provided as one of the components of the controller 1100.

The controller 1100 and the memory device 1200 may be integrated in a single semiconductor device. In accordance with an embodiment, the controller 1100 and the semiconductor memory device 1200 may be integrated into a single semiconductor device to form a memory card such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), a universal flash storage (UFS), or the like.

The controller 1100 and the memory device 1200 may be integrated into a single semiconductor device to form a solid state drive (SSD). The solid state drive SSD may include a storage device configured to store data in a semiconductor memory. When the memory system 1000 is used as a semiconductor drive (SSD), operational rates of the host coupled to the memory system 1000 may be significantly improved.

In another example, the memory system 1000 may be provided as one of various elements of an electronic device such as a computer, a ultra-mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture player, a digital picture recorder, a digital video recorder, a device capable of transmitting/receiving information in an wireless environment, one of various devices for forming a home network, one of various electronic devices for forming a computer network, one of various electronic devices for forming a telematics network, an RFID device, or one of various elements for forming a computing system, or the like.

In an embodiment, the memory device 1200 or the memory system 1000 may be embedded in packages in various forms. For example, the memory device 1200 or the memory system 1000 may be embedded in packages such as a package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flatpack (TQFP), a small outline (SOIC), a shrink small outline package (SSOP), a thin small outline (TSOP), a thin quad flatpack (TQFP), a system in package (SIP), a multichip package (MCP), a wafer-level fabricated package (WFP), a wafer-level processed stack package (WSP), or the like.

Figure 11:
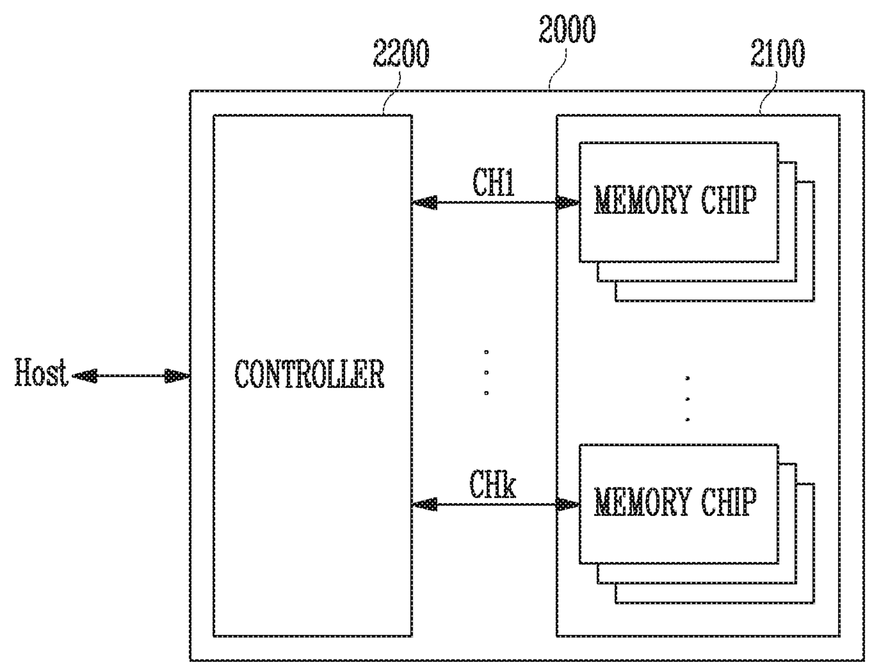
FIG. 11 is a block diagram illustrating an exemplary application of a memory system shown in FIG. 10.

FIG. 11 is a block diagram illustrating an exemplary application of the memory system shown in FIG. 10.

Referring to FIG. 11, the memory system 2000 may include a memory device 2100 and a controller 2200. The memory device 2100 may include a plurality of memory chips. The memory chips may be divided into a plurality of groups.

FIG. 11 illustrates each of k groups of memory chips communicating with the controller 2200 through first to k-th channels CH1 to CHk, respectively. Each of the memory chips may be configured and operated in the same manner as one of the memory devices 1200 described with reference to FIG. 1.

Each group may be configured to communicate with the controller 2200 through a single common channel. The controller 2200 may be configured in substantially the same manner as the controller 1100 described with reference to FIG. 10, and configured to control the plurality of memory chips of the memory device 2100.

Figure 12:
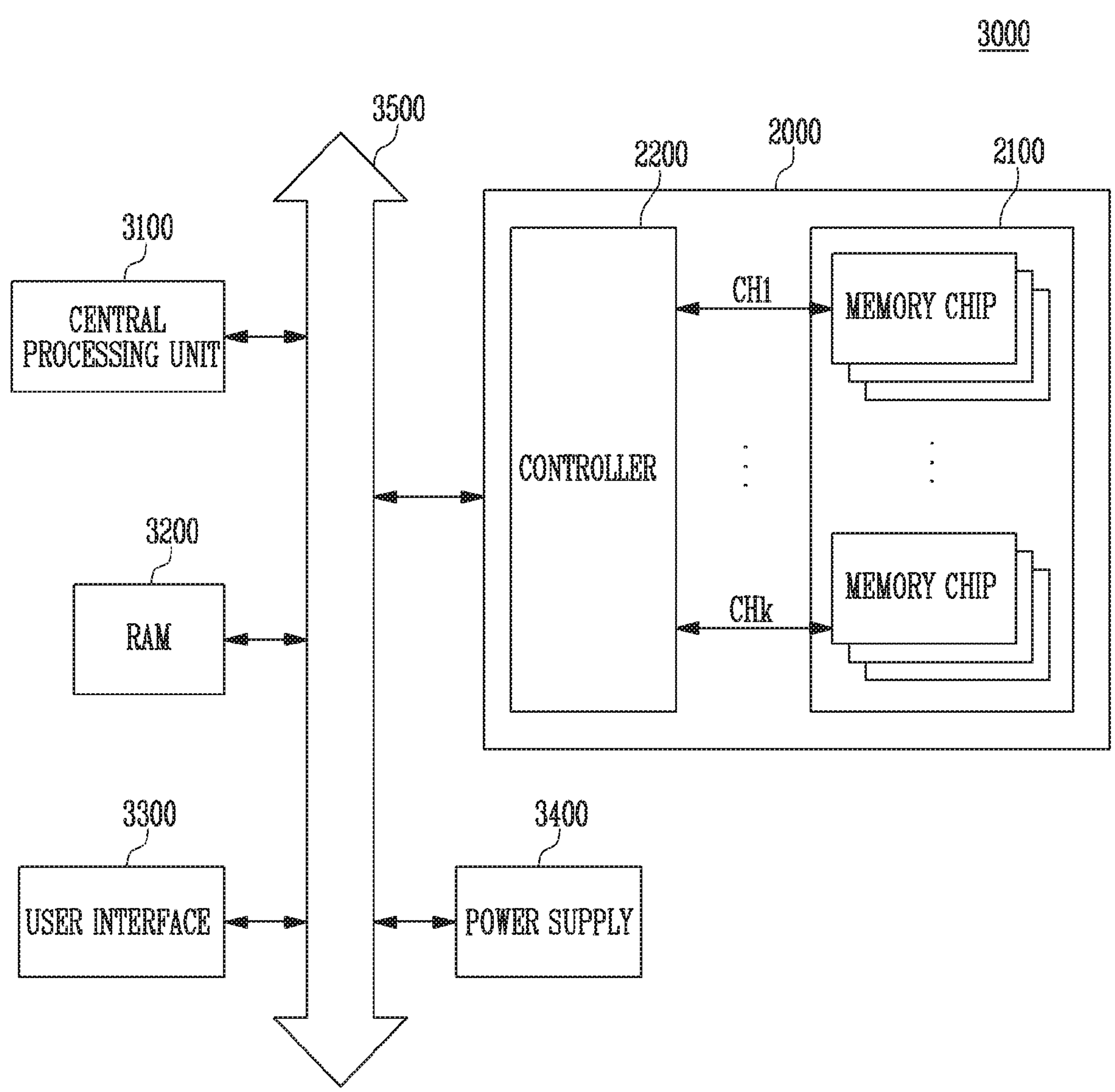
FIG. 12 is a block diagram illustrating an exemplary computing system including a memory system described with reference to FIG. 11.

FIG. 12 is a block diagram illustrating a computing system 3000 including the memory system 2000 shown in FIG. 11.

Referring to FIG. 12, the computing system 3000 may include a central processing unit (CPU) 3100, a random access memory (RAM) 3200, a user interface 3300, a power supply 3400, a system bus 3500, and the memory system 2000.

The memory system 2000 may be electrically coupled to the central processing unit 3100, the RAM 3200, the user interface 3300, and the power supply 3400 through the system bus 3500. Data provided through the user interface 3300 or data processed by the central processing unit 3100 may be stored in the memory system 2000.

FIG. 12 illustrates that the memory device 2100 is coupled to the system bus 3500 through the controller 2200. However, the memory device 2100 may be directly coupled to the system bus 3500. The functions of the controller 2200 may be performed by the central processing unit 3100 and the RAM 3200.

Referring to FIG. 12, the memory system 2000 described with reference to FIG. 11 may be provided. However, the memory system 2000 may be replaced with the memory system 1000 described with reference to FIG. 10. In accordance with an embodiment, the computing system 3000 may include both of the memory systems 1000 and 2000 described above with reference to FIGS. 10 and 11, respectively.

In accordance with embodiments of the present disclosure, a duty cycle variation caused by a difference between an external power voltage and an internal power voltage may be reduced, and a setting time for a buffer circuit may be reduced by overdriving a supply voltage during an initial setting period.

While various embodiments of the present invention have been described and illustrated, it will be apparent to those skilled in the art that various modifications can be made to such embodiments without departing from the spirit or scope of the invention. Thus, the present invention covers all such modifications that come within the scope of the appended claims and their equivalents.

In the above-discussed embodiments, all steps may be selectively performed or skipped. In addition, the steps in each embodiment may not always be performed in regular order. Furthermore, the disclosed embodiments aim to help those with ordinary knowledge in this art to more clearly understand the present disclosure rather than limit the bounds of the present disclosure. In other words, one skilled in the art to which the present disclosure pertains will be able to easily understand that various modifications are possible in light of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic inventive concept described herein will still fall within the spirit and scope of the present disclosure as defined in the accompanying claims and equivalents thereof.

What is claimed is:

1. A buffer circuit, comprising:

a first buffer configured to operate at an external power voltage, generate first and second buffer signals by comparing an input signal with a reference voltage, and control potential levels of the first and second buffer signals to be less than an internal power voltage on the basis of a common mode feedback voltage;

a second buffer configured to operate at the internal power voltage and generate an output signal in response to the first and second buffer signals; and a replica circuit configured to generate the common mode feedback voltage on the basis of the internal power voltage.

2. The buffer circuit of claim 1, wherein the first buffer comprises:

a first buffer component configured to operate at the external power voltage and generate third and fourth buffer signals by comparing the input signal with the reference voltage; and a second buffer component configured to operate at the external power voltage and generate the first and second buffer signals on the basis of the third and fourth buffer signals.

3. The buffer circuit of claim 2, wherein the first buffer component is activated in response to an external voltage enable mask signal and outputs the third and fourth buffer signals by controlling potential levels of the third and fourth buffer signals on the basis of a self-voltage generated by the replica circuit.

4. The buffer circuit of claim 3, wherein the second buffer component is activated in response to the external voltage enable mask signal and generates the first and second buffer signals, each having a potential level less than or equal to a potential level of the common mode feedback voltage, on the basis of the common mode feedback voltage.

5. The buffer circuit of claim 1, wherein the replica circuit generates a self-voltage by dividing the external power voltage in response to a first enable signal, and the replica circuit generates a common voltage in response to the first enable signal and the common mode feedback voltage and generates the common mode feedback voltage to have the same voltage level as a divided voltage of the internal power voltage by comparing the common voltage with the divided voltage.

6. The buffer circuit of claim 5, wherein the common voltage is half (½) of the internal power voltage.

7. The buffer circuit of claim 5, wherein the replica circuit comprises a comparator that generates the common mode feedback voltage by comparing the common voltage with the divided voltage, and the comparator generates the common mode feedback voltage increased by a supply voltage overdriven in an initial setting operation period.

8. The buffer circuit of claim 7, further comprising an overdrive circuit configured to output the supply voltage to be greater than a target voltage level by using the external power voltage in response to an external voltage enable signal in the initial setting operation period, and output the supply voltage at the target voltage level after the initial setting operation period.

9. The buffer circuit of claim 3, wherein the second buffer is activated in response to an internal voltage enable mask signal and an inverted internal voltage enable mask signal.

10. The buffer circuit of claim 9, wherein the internal voltage enable mask signal is activated after the external voltage enable mask signal is activated, and the external voltage enable mask signal is deactivated after the internal voltage enable mask signal is deactivated.

11. A buffer circuit, comprising:

a first buffer configured to operate at an external power voltage, generate first and second buffer signals by comparing an input signal with a reference voltage, and control potential levels of the first and second buffer signals on the basis of a self-voltage;

a second buffer configured to operate at the external power voltage, generate third and fourth buffer signals in response to the first and second buffer signals, and control potential levels of the third and fourth buffer signals to be less than an internal power voltage on the basis of a common mode feedback voltage; and a third buffer configured to operate at the internal power voltage and generate an output signal in response to the third and fourth buffer signals.

12. The buffer circuit of claim 11, further comprising a replica circuit configured to generate the self-voltage to be less than the external power voltage and the common mode feedback voltage to be less than the internal power voltage.

13. The buffer circuit of claim 12, wherein the replica circuit generates the self-voltage by dividing the external power voltage in response to a first enable signal, and the replica circuit generates a common voltage in response to the first enable signal and the common mode feedback voltage and generates the common mode feedback voltage to have the same voltage level as a divided voltage of the internal power voltage by comparing the common voltage with the divided voltage.

14. The buffer circuit of claim 13, wherein the replica circuit comprises a comparator that generates the common mode feedback voltage by comparing the common voltage with the divided voltage, and the comparator generates the common mode feedback voltage increased by a supply voltage overdriven in an initial setting operation period.

15. The buffer circuit of claim 14, further comprising an overdrive circuit configured to output the supply voltage to be greater than a target voltage level by using the external power voltage in response to an external voltage enable signal in the initial setting operation period, and output the supply voltage at the target voltage level after the initial setting operation period.

16. A memory device, comprising:

a buffer circuit configured to buffer an input signal from an external device and output a buffered input signal as an output signal; and an internal circuit configured to perform operations in response to the output signal output from the buffer circuit, wherein the buffer circuit comprises:

a first buffer configured to operate at an external power voltage, generate first and second buffer signals by comparing the input signal with a reference voltage, and control potential levels of the first and second buffer signals to be less than an internal power voltage on the basis of a common mode feedback voltage;

a second buffer configured to operate at the internal power voltage and generate the output signal in response to the first and second buffer signals; and a replica circuit configured to generate the common mode feedback voltage on the basis of the internal power voltage.

17. The memory device of claim 16, wherein the first buffer comprises:

a first buffer component configured to operate at the external power voltage and generate third and fourth buffer signals by comparing the input signal with the reference voltage; and a second buffer component configured to operate at the external power voltage and generate the first and second buffer signals on the basis of the third and fourth buffer signals.

18. The memory device of claim 17, wherein the first buffer component is activated in response to an external voltage enable mask signal and controls potential levels of the third and fourth buffer signals on the basis of a self-voltage generated by the replica circuit.

19. The memory device of claim 18, wherein the second buffer component is activated in response to the external voltage enable mask signal and generates the first and second buffer signals having potential levels less than or equal to a potential level of the common mode feedback voltage on the basis of the common mode feedback voltage.

20. The memory device of claim 16, wherein the replica circuit generates a self-voltage by dividing the external power voltage in response to a first enable signal, and the replica circuit generates a common voltage in response to the first enable signal and the common mode feedback voltage and generates the common mode feedback voltage to have the same voltage level as a divided voltage of the internal power voltage by comparing the common voltage with the divided voltage.

21. The memory device of claim 20, wherein the replica circuit comprises a comparator that generates the common mode feedback voltage by comparing the common voltage with the divided voltage, and the comparator generates the common mode feedback voltage increased by a supply voltage overdriven in an initial setting operation period.

* * * * *